United States Patent
Ge et al.

(10) Patent No.: US 10,475,780 B2
(45) Date of Patent: Nov. 12, 2019

(54) LEVEL SHIFTER SPARE CELL

(71) Applicant: NXP USA, INC., Austin, TX (US)

(72) Inventors: Zhe Ge, Suzhou (CN); Miaolin Tan, Suzhou (CN); Peidong Wang, Suzhou (CN)

(73) Assignee: NXP USA, Inc., Austin, TX (US)

( * ) Notice: Subject to any disclaimer, the term of this patent is extended or adjusted under 35 U.S.C. 154(b) by 30 days.

(21) Appl. No.: 15/703,995

(22) Filed: Sep. 14, 2017

(65) Prior Publication Data

US 2019/0067263 A1 Feb. 28, 2019

(30) Foreign Application Priority Data

Aug. 31, 2017 (CN) .......................... 2017 1 0777355

(51) Int. Cl.
 *H01L 27/02* (2006.01)
 *G11C 7/10* (2006.01)
 *G06F 17/50* (2006.01)
 *G11C 29/00* (2006.01)

(52) U.S. Cl.
 CPC ...... *H01L 27/0207* (2013.01); *G06F 17/5054* (2013.01); *G06F 17/5072* (2013.01); *G11C 7/1051* (2013.01); *G11C 7/1057* (2013.01); *G11C 7/1084* (2013.01); *G11C 29/82* (2013.01)

(58) Field of Classification Search
 CPC .................................................. G11B 20/1889
 USPC ........................................ 714/710, 719, 714
 See application file for complete search history.

(56) References Cited

U.S. PATENT DOCUMENTS

| 4,845,381 | A | | 7/1989 | Cuevas | |
|---|---|---|---|---|---|
| 5,825,205 | A | * | 10/1998 | Ohtsuka | G11C 16/08 326/81 |
| 7,477,073 | B1 | * | 1/2009 | Tuan | H03K 19/17736 326/101 |
| 7,548,093 | B1 | * | 6/2009 | Priel | H03K 19/018521 326/63 |
| 8,645,892 | B1 | | 2/2014 | Gupta et al. | |
| 8,810,280 | B2 | | 8/2014 | Pyapali | |
| 8,878,387 | B1 | * | 11/2014 | Wong | G05F 1/613 307/18 |
| 8,975,943 | B2 | * | 3/2015 | Lou | H03K 3/356182 326/81 |
| 9,124,259 | B2 | * | 9/2015 | Kimoto | H03K 3/356069 |
| 9,154,135 | B1 | | 10/2015 | Jajodia et al. | |
| 2006/0232526 | A1 | * | 10/2006 | Guttag | G09G 3/34 345/84 |
| 2009/0212842 | A1 | * | 8/2009 | Illegems | H03K 3/356182 327/333 |
| 2010/0026343 | A1 | * | 2/2010 | Yang | H03K 19/018521 326/80 |
| 2012/0049887 | A1 | * | 3/2012 | Sood | H03K 3/356113 326/80 |
| 2013/0151919 | A1 | * | 6/2013 | Huynh | G06F 1/26 714/746 |
| 2013/0338991 | A1 | * | 12/2013 | Lin | G06F 17/5036 703/14 |

(Continued)

*Primary Examiner* — Fritz Alphonse

(57) ABSTRACT

A method for configuring level shifter spare cells includes providing a power rail connectable to a corresponding power domain, and providing a spare cell including a level shifter circuit. The level shifter circuit has first and second terminals that are connectable to the power rail, and the first and second terminals are floating with respect to the power rail.

10 Claims, 4 Drawing Sheets

(56) References Cited

U.S. PATENT DOCUMENTS

2015/0149841 A1* 5/2015 Gerber ................ G06F 13/4068
  714/721
2018/0294813 A1* 10/2018 Cascio ........... H03K 19/018521

* cited by examiner

US 10,475,780 B2

LEVEL SHIFTER SPARE CELL

BACKGROUND

The present invention generally relates to a level shifter spare cell and, more particularly, to a method for configuring the level shifter spare cell for shifting levels among power domains.

In integrated circuits having different power domains, level shifters are needed to convert signal power levels for signal transitions between the different power domains. Spare cells are provided in integrated circuits for correcting design errors or malfunctions detected after a mask set of an integrated circuit has been formed (i.e., post-mask). For malfunctions between power domains, normally multiple level shifter spare cells are provided corresponding to each possible path from one power domain to another. For example, in a system having two power domains, Vdd1 and Vdd2, at least two level shifter spare cells are required, with one of the spare cells for the connection from Vdd1 to Vdd2, and the other for the connection from Vdd2 to Vdd1. Accordingly, for a system having 'n' power domains, the number of the level shifter spare cells is at least $n*(n-1)$.

FIG. 1 is a schematic diagram of an integrated circuit or system having multiple power domains and corresponding connections of spare cells between the multiple power domains. The system 100 includes four power domains, respectively domain a, domain b, domain c, and domain d. Arrows between two of the power domains represent the possible paths for level shifter spare cells to be coupled. Operations of the level shifters have directions, which means that for the conversion of power levels between domain a and domain b, two level shifters are used, respectively from domain a to domain b, and from domain b to domain a. In the system 100, at least twelve spare cells are used to cover the possible paths between the four power domains.

Spare cells usually are distributed along boundaries of the power domains, which normally are considered as critical areas because of the high density and high occupancy of circuit devices. On the other hand, as compared with normal combinational logic devices, level shifter cells are relatively large in size and accordingly consume more space in the critical areas. Further, if more than one level shifter is used for the normal operation in one of the paths, then the same number of level shifter spare cells must be coupled in the path, which adds to the circuit occupancy and density in these critical areas.

It would be advantageous to have flexible spare cells that require less area to save space in critical areas.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a method for configuring level shifter spare cells. The method includes providing at least one power rail connectable to a corresponding power domain, where the power domain has a power level, and providing at least one spare cell comprising a level shifter circuit. The level shifter circuit has first and second terminals that are connectable to the at least one power rail. The method further comprises floating the first and second terminals with respect to the at least one power rail.

In another embodiment, the present invention provides an integrated circuit that includes at least one power rail and at least one spare cell. The at least one power rail is connectable to a corresponding power domain. The at least one spare cell includes a level shifter circuit. The level shifter circuit has first and second terminals that are connectable to the at least one power rail. The first and second terminals are floating with respect to the at least one power rail.

In yet another embodiment, the present invention is an integrated circuit having multiple power rails and multiple spare cells. The multiple power rails are each coupled with a corresponding power domain having a corresponding power level. The multiple spare cells each includes a corresponding level shifter circuit couplable to one of the multiple power rails at a first terminal and couplable to the one or another one of the multiple power rails at a second terminal. At least one of the multiple power rails is not couplable to another power rail through the level shifter spare cell.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
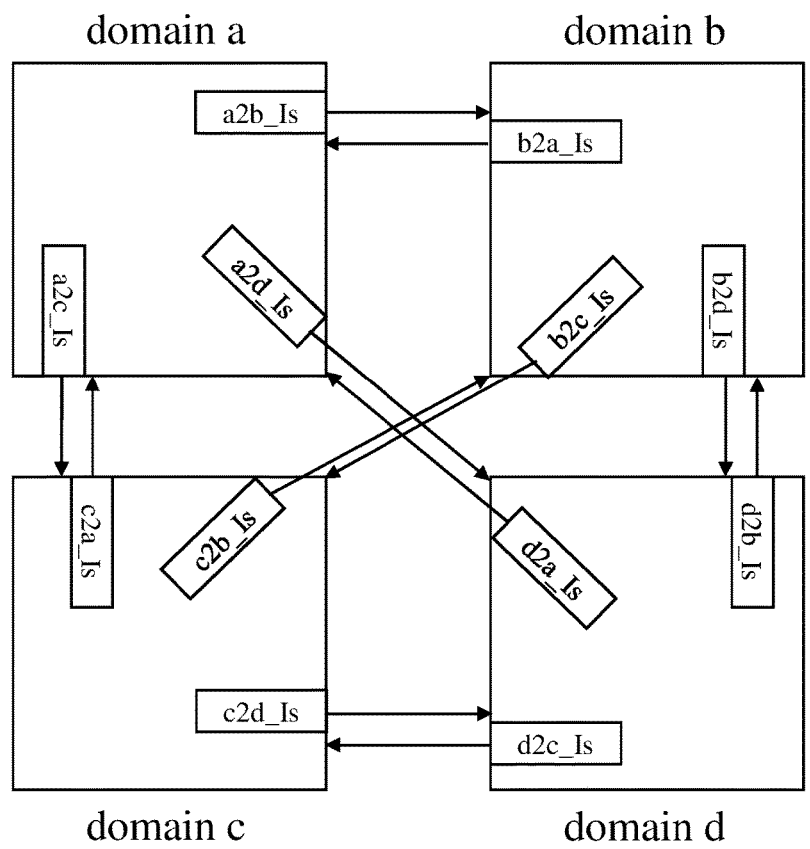
FIG. 1 is a schematic diagram of an integrated circuit having multiple power domains and corresponding connections of spare cells between the multiple power domains.
Figure 2:
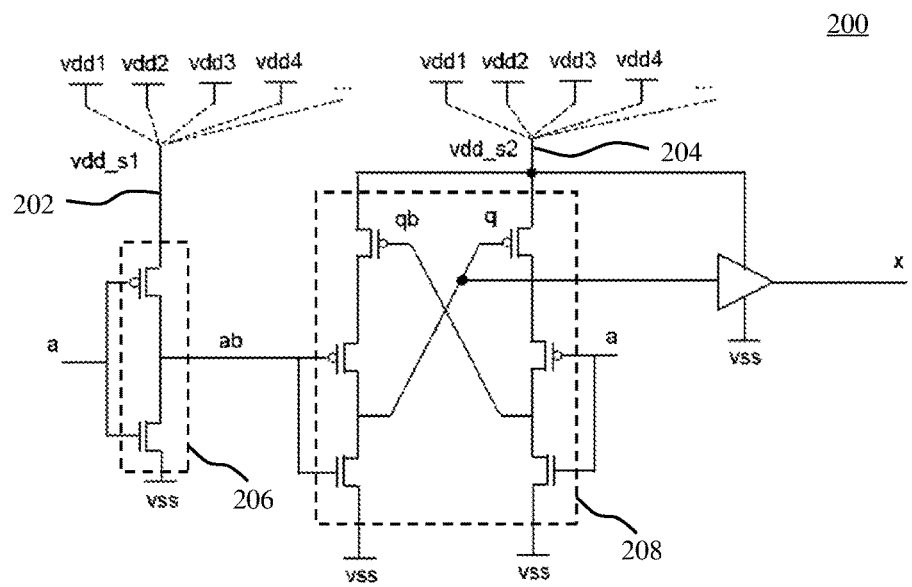
FIG. 2 is a circuit diagram of a level shifter spare cell in accordance with an exemplary embodiment of the present invention.

FIG. 2 is a schematic circuit diagram of a spare cell including a level shifter circuit 200 in accordance with an exemplary embodiment of the present invention. The level shifter circuit 200 includes a first terminal 202 and a second terminal 204. The level shifter circuit 200 receives an input signal at an input terminal a, and provides an output signal with a shifted voltage level at an output terminal x. The level shifter circuit 200 includes multiple transistors that are connected to form inverters 206 and 208. Typically, the inverters each includes a P-channel transistor and an N-channel transistor connected in series with the gate terminals thereof coupled in common to an input signal, and a node between the transistors providing an output signal. The inverter 206, which is coupled to receive the input signal a, is coupled to the first terminal 202 to operate at a first power level, and the inverter 208, which is coupled to provide the output signal x, is coupled to the second terminal 204 to operate at a second power level.

Each of the first and second terminals 202 and 204 is couplable to one of multiple power supplies. The multiple power supplies include Vdd1, Vdd2, Vdd3, Vdd4, etc. The dashed lines in FIG. 2 between the first and second terminals 202, 204 and the multiple power supplies indicate that the first and second terminal 202, 204 are floating with respect to the power supplies. That is, they are connectable but not yet connected.

Figure 3:
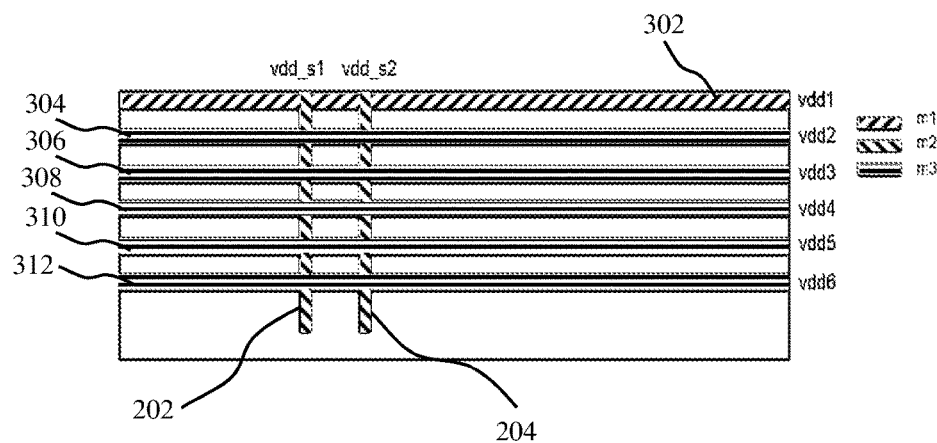
FIG. 3 is a layout schematic diagram of first and second terminals the spare cell of FIG. 2 and multiple power rails according to an exemplary embodiment of the present invention.

Referring to FIG. 3, a layout schematic diagram of the first and second terminals of the level shifter circuit 200 shown in FIG. 2 and multiple power rails according to an exemplary embodiment is shown. The multiple power supplies are each couplable to a corresponding power rail. FIG. 3 shows six power supplies with corresponding power levels Vdd1 to Vdd6, and each of the power supplies is connectable to a corresponding power rail 302, 304, . . . , 312. In integrated circuits that include multiple power domains, the power levels Vdd1 to Vdd6 represent the potential levels of the power domains. In the current embodiment, as shown in FIG. 3, the first and second terminals 202, 204 extend in a first direction, and the power rails 302 to 312 extend in a second direction. The second direction is at an angle with respect to the first direction. Preferably, the second direction is perpendicular to the first direction. In alternative embodiments, other angles are applicable. In still further alternative embodiments, the first and second terminals 202, 204 are disposed to be parallel with the power rails 302 to 312.

The first and second terminals 202, 204 are provided in a layer different than a layer in which the power rails 302 to 312 are provided. Although FIG. 3 shows the power rail 302 coupling with the power level Vdd1 in a different layer from the layer that the other power rails 304 to 312 are provided, in alternative embodiments, the power rails can be respectively provided in more or fewer layers. According to the embodiment described above, the first and second terminals 202, 204 are by default floating with respect to the power rails in a different layer, which enables the level shifter spare cells to be coupled with desired power rails as needed. According to alternative embodiments, the first and second terminals 202, 204 are provided in the same layer with one or more of the power rails, in which case the described "floating" means the first and second terminals 202, 204 are not connected with the power rails.

In order to provide spare cells for every possible path from one of the power levels to another, if each path is provided with one level shifter spare cell, as many as 30 spare cells are needed to couple with the power rails. However, using the spare cell of the present invention, the number of level shifter spare cells is needed is 6*(6−1)*1. However, it is recognized that it is not necessary to perform the conversion from at least some of the power domains to some others. According to an embodiment of the current invention, the number of level shifter spare cells is less than n*(n−1), where n is the number of power domains in the system/integrated circuit. In the current embodiment, the number of level shifter spare cells is configured according to the required application of level conversion requirements, as long as it is adequate to perform the required post-mask ECO (engineering change order) level shifting functions in the system. For example, amongst the illustrated six power domains, if an estimation indicates that it is required to perform the post-mask eco level shifting function in four of the overall 30 possible paths and each of the four paths requires only one level shifting operation, it is necessary to provide just four or slightly more than four level shifter spare cells. As a result, as compared to providing 30 spare cells, the space required by the four (4) level shifter spare cells is largely saved.

Figure 4:
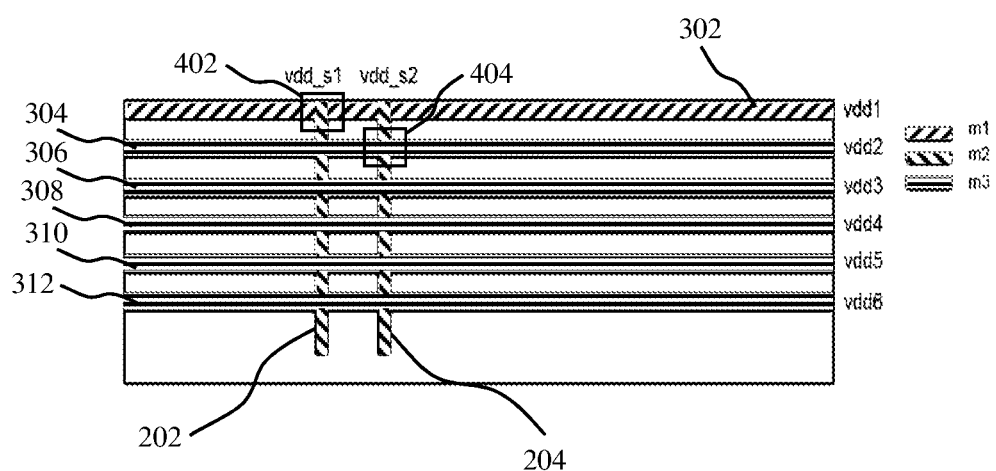
FIG. 4 is a layout schematic diagram of FIG. 3 showing the first and second terminals of a level shifter spare cell with respect to the power rails according to an exemplary embodiment of the present invention.

Referring now to FIG. 4, a layout schematic diagram of the first and second terminals of the level shifter circuit 200 shown in FIG. 2 and multiple power rails according to an exemplary embodiment is shown. A first coupler 402 is coupled with the first terminal 202 and the first power rail 302, while a second coupler 404 is coupled with the second terminal 204 and the second power rail 304. With reference to FIG. 2, the level shifter circuit 200 in this case operates to shift the signal level from Vdd1, which is coupled to the first power rail 302, to Vdd2, which is coupled to the second power rail 304. The first and second terminals of the level shifter spare cells are configured to be floating over the power rails, if more than one level shifter spare cell is required in one of the paths, multiple floating level shifter spare cells are readily coupled in the path.

Figure 5:
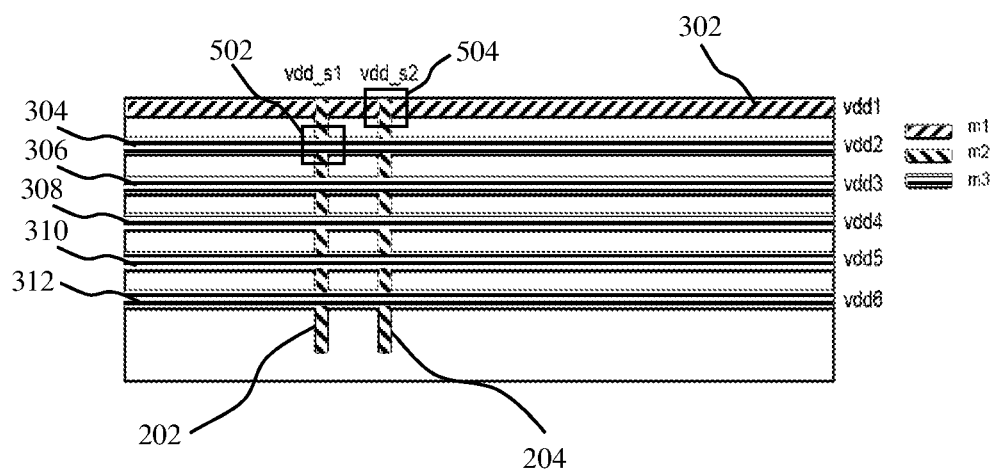
FIG. 5 is a layout schematic diagram showing the first and second terminals of the level shifter spare cell of FIGS. 3 and 4 with respect to the power rails according to an exemplary embodiment of the present invention.

Referring to FIG. 5, a layout schematic diagram of the first and second terminals of the level shifter circuit 200 shown in FIG. 2 and multiple power rails according to an exemplary embodiment is shown. In FIG. 5, the first terminal 202 is coupled with the second power rail 304 through a first coupler 502, while the second terminal 204 of the level shifter spare cell is coupled with the first power rail 302 through a second coupler 504. With reference to FIG. 2, the level shifter circuit 200 in this connection case operates to shift the signal level from Vdd2, which is coupled to the second rail 304, to Vdd1, which is coupled to the first power rail 302. It can now be seen from FIGS. 4 and 5 that the present invention enables the level shifter spare cell to be coupled and adopted in different directions of level shifting operations.

The couplers 402, 404, 502 and 504 for coupling the first and second terminals to correspondingly required power rails can be implemented in various ways. In one embodiment, because the first and second terminals 202 and 204 are disposed in a different layer from the layer of the power rails, vias are formed at positions of their intersections through the different layers, to connect the first and second terminals with corresponding power rails. In alternative embodiments, logic gates or applicable switches are used for controlling the connection and/or disconnection of the first and second terminals of the level shifter and the corresponding power rails.

As described above, according to the present invention, the number of level shifter spare cells is less than n*(n−1), which means that after the level shifter spare cells are connected by ways of that described with reference to FIGS. 4 and 5, there are still at least some or at least one of the power rails not coupled to another power rail through the level shifter spare cell. Taking a system including three (3) power domains for example, there are altogether six (6) paths for connecting possible spare cell level shifters from one to another. If the number of level shifter spare cells is 4, which is less than 3*(3−1), after connection there are at least two (2) paths unconnected with the level shifter spare cells. In application, the level shifter spare cells are connected to those paths that require signal level shifting, while those paths that do not require signal level shifting between the corresponding power domains remain unconnected with the level shifters, which can save both space, and enable the system design to be compact and efficient.

Figure 6:
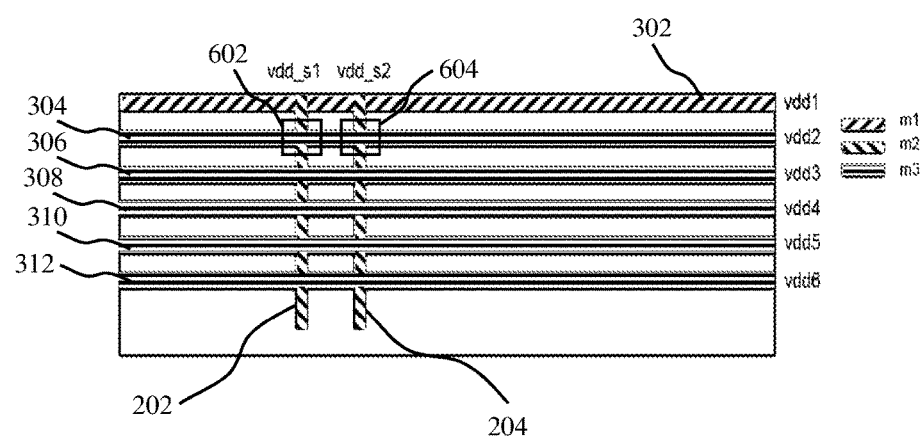
FIG. 6 is a layout schematic diagram of another connection of the level shifter spare cell of FIG. 2 and the corresponding power rails according to another exemplary embodiment of the present invention.

FIG. 6 illustrates another connection scenario of the level shifter spare cells with corresponding power rails. The first and second terminals 202 and 204 in this embodiment are both coupled with the second power rail 304 through respective couplers 602 and 604. With reference to FIG. 2, if the power level at the input stage is the same as the power level at the output stage, the level shifter circuit 200 functions as a buffer circuit. In alternative embodiments, the first and second terminals of the same level shifter spare cell can be coupled with a power rail other than the illustrated second power rail 304, to be a buffer circuit operating at the coupled power level.

It can now be seen that the embodiments of the present invention provide the power terminals of the level shifter circuit in a layer different from the layer that the power rails are provided. The terminals of the level shifter spare cells are configured to be floating with respect to the power rails, such that the level shifter spare cells can be coupled to have flexible shifting directions, or even can be coupled to operate as a buffer circuit. The level shifter spare cells are flexible and configurable to be adopted in more than one operation. The number of the level shifter spare cells is less than a number of the possible shifting paths amongst the power domains, such that the space is not occupied by useless level shifter spare cells connected in the paths that do not require level shifting. The apparatus and method for configuring level shifter spare cells of the present disclosure can save the level shifter spare cells and their required spaces, and enables the overall size of the system to be compact and efficient.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. An integrated circuit, comprising:
   at least one power rail connectable to a corresponding power domain, wherein the power domain has a power level; and
   at least one spare cell comprising a level shifter circuit, wherein the level shifter circuit has first and second terminals that are connectable to the at least one power rail,
   wherein the first and second terminals of the level shifter circuit are floating with respect to the at least one power rail.

2. The apparatus of claim 1, wherein the first and second terminals of the level shifter circuit are in a different layer from a layer of the at least one power rail.

3. The apparatus of claim 2, further comprising:
   a first via for coupling the first terminal of the level shifter circuit with the at least one power rail; and
   a second via for coupling the second terminal of the level shifter circuit with the at least one power rail or another one of the at least one power rails.

4. The apparatus of claim 1, wherein a number of the spare cells is less than n*(n−1), wherein n is a number of the power domains.

5. The apparatus of claim 1, wherein the at least one power rail extends in a first direction, and the first and second terminals of the level shifter circuit extend in a second direction that is at an angle with respect to the first direction.

6. The apparatus of claim 5, wherein the first and second terminals of the level shifter circuit are perpendicular to the at least one power rail.

7. The apparatus of claim 1, wherein the first and second terminals of the level shifter circuit are connectable to a same power rail through first and second vias such that the level shifter circuit operates as a buffer circuit.

8. An integrated circuit having a plurality of power domains, comprising:
   multiple power rails each coupled with a corresponding one of the power domains and each having a corresponding power level; and
   multiple spare cells each comprising a level shifter circuit that can be coupled to one of the power rails at a first terminal, and to another of the power rails at a second terminal,
   wherein at least one of the power rails cannot be coupled to another power rail by way of the spare cells.

9. The integrated circuit of claim 8, wherein the first and second terminals of the level shifter circuit are floating with respect to the multiple power rails.

10. The integrated circuit of claim 8, wherein the first and second terminals are formed in a different layer from a layer of the multiple power rails, and the integrated circuit further comprises multiple vias that can be coupled to the first and second terminals and to the multiple power rails.

* * * * *